US009769942B2

(12) United States Patent
Longo (10) Patent No.: US 9,769,942 B2
(45) Date of Patent: Sep. 19, 2017

(54) RETRACTABLE DISPLAY ASSEMBLY (71) Applicant: Frederick Longo, Pompano Beach, FL (US)

(72) Inventor: Frederick Longo, Pompano Beach, FL (US)

(*) Notice: Subject to any disclaimer, the term of this patent is extended or adjusted under 35 U.S.C. 154(b) by 134 days.

(21) Appl. No.: 14/750,138

(22) Filed: Jun. 25, 2015

(65) Prior Publication Data
US 2016/0379589 A1    Dec. 29, 2016

(51) Int. Cl.
*G06F 1/16* (2006.01)
*H05K 5/00* (2006.01)
*H05K 7/00* (2006.01)
*H05K 5/02* (2006.01)
*G09F 9/30* (2006.01)
*G06F 3/147* (2006.01)

(52) U.S. Cl.
CPC ......... *H05K 5/0221* (2013.01); *G06F 1/1601* (2013.01); *G06F 1/1652* (2013.01); *G09F 9/301* (2013.01); *G06F 3/147* (2013.01); *G06F 2200/1612* (2013.01); *G09G 2380/02* (2013.01)

(58) Field of Classification Search
CPC ...... G06F 1/1601; G06F 1/1616; G06F 3/147; G09G 3/004–3/006; G03B 21/58; H05K 5/0221
See application file for complete search history.

(56) References Cited

U.S. PATENT DOCUMENTS

| 6,191,886 | B1* | 2/2001 | Sinkoff | G03B 21/58 160/24 |
| 7,336,896 | B2 | 2/2008 | Jutamulia | |
| 7,529,042 | B2 | 5/2009 | Losee | |
| 7,792,550 | B2 | 9/2010 | Lishan | |
| D695,731 | S | 12/2013 | Adami | |
| D709,075 | S | 7/2014 | Miniard | |
| 2004/0061683 | A1* | 4/2004 | Mochizuki | G06F 1/1601 345/168 |
| 2007/0241721 | A1* | 10/2007 | Weinstein | H01M 2/1022 320/114 |
| 2008/0024884 | A1 | 1/2008 | Rowe et al. | |
| 2012/0140318 | A1* | 6/2012 | Wang | G03B 21/58 359/443 |
| 2012/0244910 | A1 | 9/2012 | Hsu | |
| 2013/0080622 | A1* | 3/2013 | Zhou | G06F 11/3006 709/224 |

(Continued)

*Primary Examiner* — Hang Lin (57) ABSTRACT

A retractable display assembly includes a housing that has a stand portion and a storage portion. The stand portion is positionable in a deployed position such that the stand portion may support the storage portion on a support surface. A screen is positioned within the housing and the screen is comprised of a flexible material that is capable of electronically displaying an image. The screen is positionable in a deployed position and a stored position. A support is hingedly coupled to the housing and the support engages the screen such that the screen is retained in the deployed position. A control circuit is coupled to the housing and the control circuit is electrically coupled to the screen. The control circuit may be placed in communication with an extrinsic electronic device such that the control circuit receives data pertaining to images from the extrinsic electronic device thereby facilitating the screen to display the images.

8 Claims, 5 Drawing Sheets (56) References Cited

U.S. PATENT DOCUMENTS

| | | | | |
|---|---|---|---|---|
| 2014/0092278 A1* | 4/2014 | Takahashi | .............. | H04N 5/772 |
| | | | | 348/231.3 |
| 2014/0362512 A1* | 12/2014 | Hinson | ................. | G06F 15/025 |
| | | | | 361/679.21 |
| 2015/0342067 A1* | 11/2015 | Gault | ................... | H05K 5/0226 |
| | | | | 248/357 |

* cited by examiner

RETRACTABLE DISPLAY ASSEMBLY

BACKGROUND OF THE DISCLOSURE

Field of the Disclosure

The disclosure relates to display devices and more particularly pertains to a new display device for displaying images stored within an extrinsic electronic device.

SUMMARY OF THE DISCLOSURE

An embodiment of the disclosure meets the needs presented above by generally comprising a housing that has a stand portion and a storage portion and the stand portion is hingedly coupled to the storage portion. The stand portion is positionable in a deployed position such that the stand portion may support the storage portion on a support surface. A screen is positioned within the housing and the screen is comprised of a flexible material that is capable of electronically displaying an image. The screen is rollably coupled to the housing such that the screen is positionable in a deployed position having the screen extending outwardly from the storage portion. The screen is positionable in a stored position having the screen being contained within the storage portion. A support is hingedly coupled to the housing and the support is positionable in a deployed position having the support extending outwardly from the storage portion. The support engages the screen when the screen is positioned in the deployed position and the support is positioned in the deployed position such that the screen is retained in the deployed position. The support is positionable in a stored position having the support being contained within the storage position. A control circuit is coupled to the housing and the control circuit is electrically coupled to the screen. The control circuit may be placed in communication with an extrinsic electronic device such that the control circuit receives data pertaining to images from the extrinsic electronic device thereby facilitating the screen to display the images.

There has thus been outlined, rather broadly, the more important features of the disclosure in order that the detailed description thereof that follows may be better understood, and in order that the present contribution to the art may be better appreciated. There are additional features of the disclosure that will be described hereinafter and which will form the subject matter of the claims appended hereto.

The objects of the disclosure, along with the various features of novelty which characterize the disclosure, are pointed out with particularity in the claims annexed to and forming a part of this disclosure.

BRIEF DESCRIPTION OF THE DRAWINGS

The disclosure will be better understood and objects other than those set forth above will become apparent when consideration is given to the following detailed description thereof. Such description makes reference to the annexed drawings wherein.

DESCRIPTION OF THE PREFERRED EMBODIMENT

Figure 1:
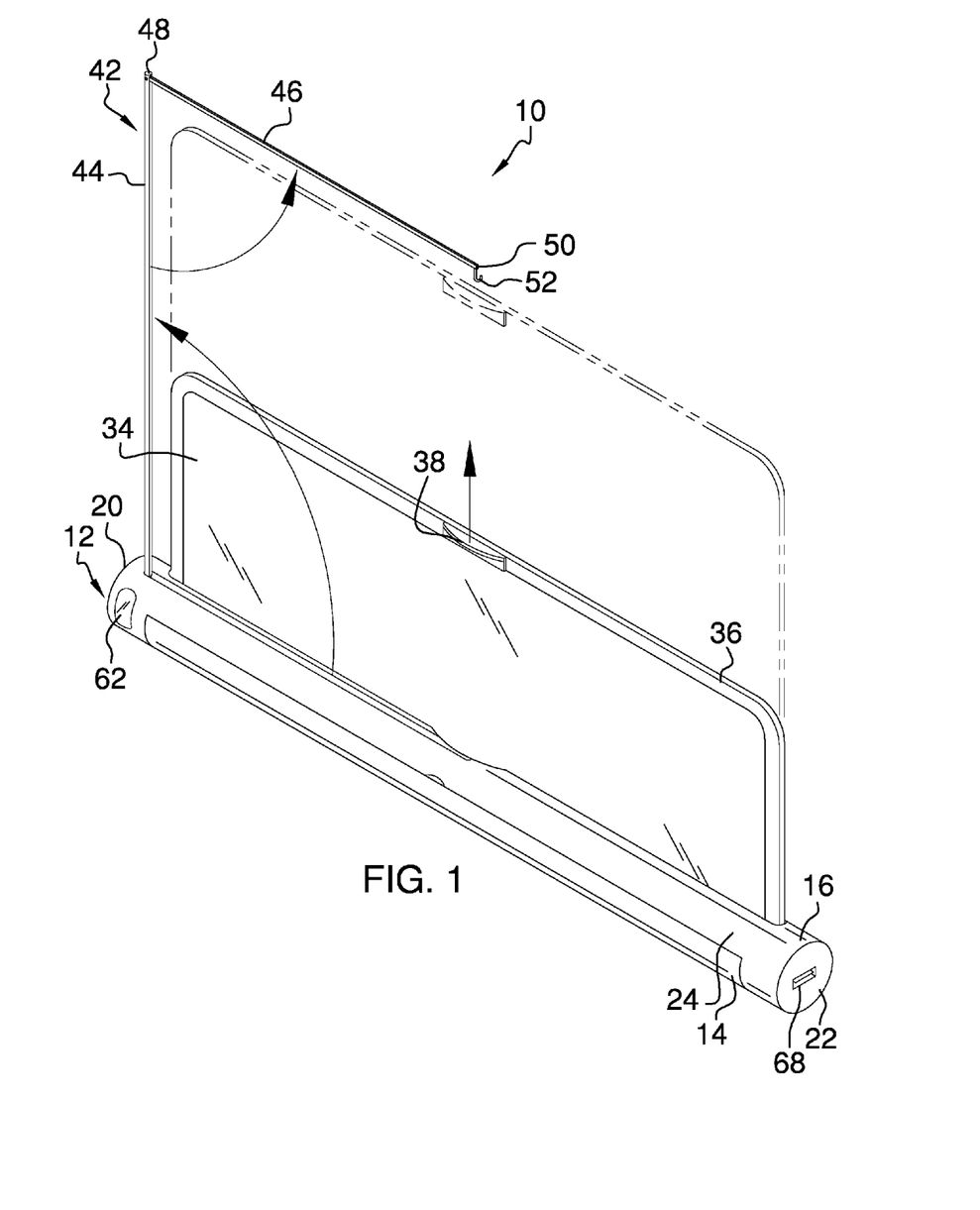
FIG. 1 is a front perspective view of a retractable display assembly according to an embodiment of the disclosure.
Figure 2:
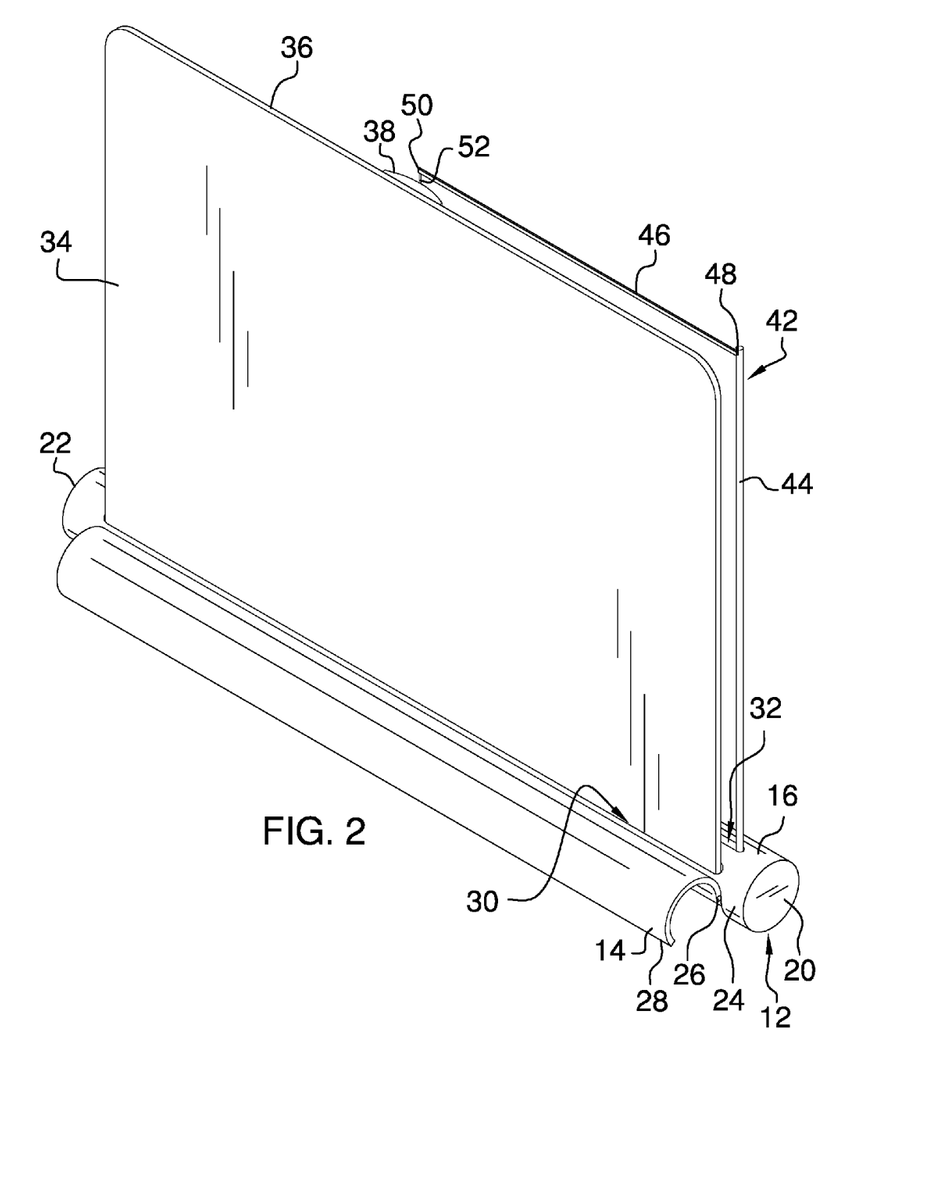
FIG. 2 is a rear perspective view of an embodiment of the disclosure.
Figure 3:
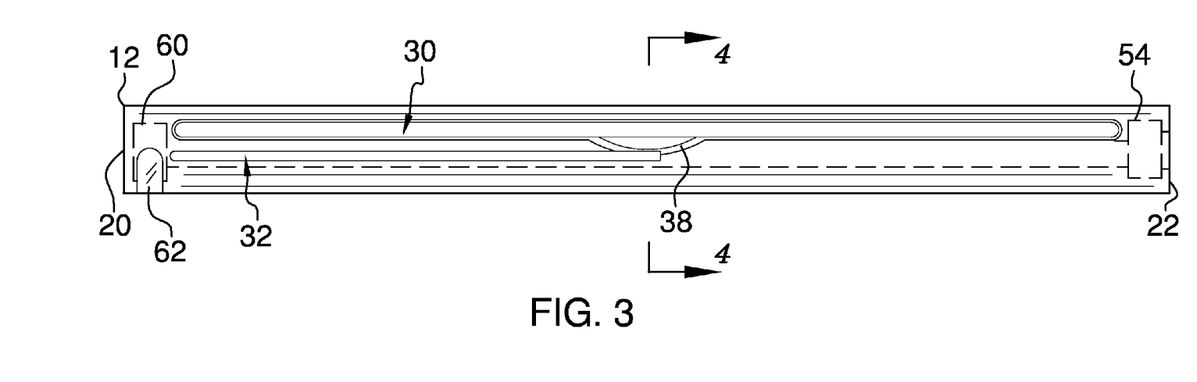
FIG. 3 is a top view of an embodiment of the disclosure.
Figure 4:
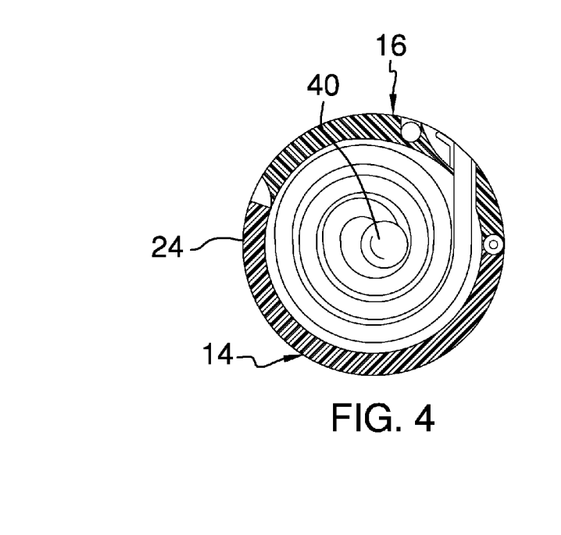
FIG. 4 is a cross sectional view taken along line 4-4 of FIG. 3 of an embodiment of the disclosure.
Figure 5:
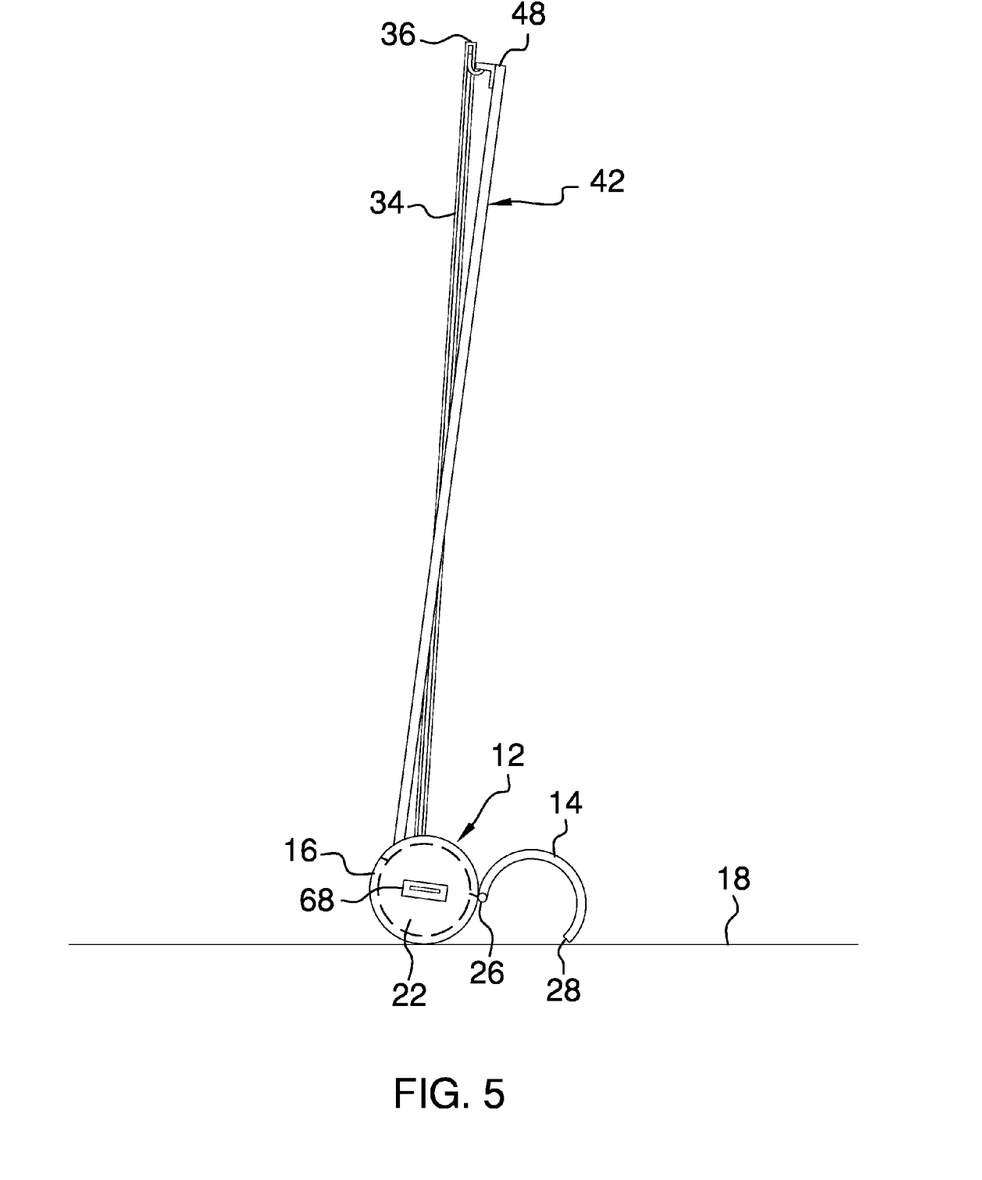
FIG. 5 is a left side view of an embodiment of the disclosure.
Figure 6:
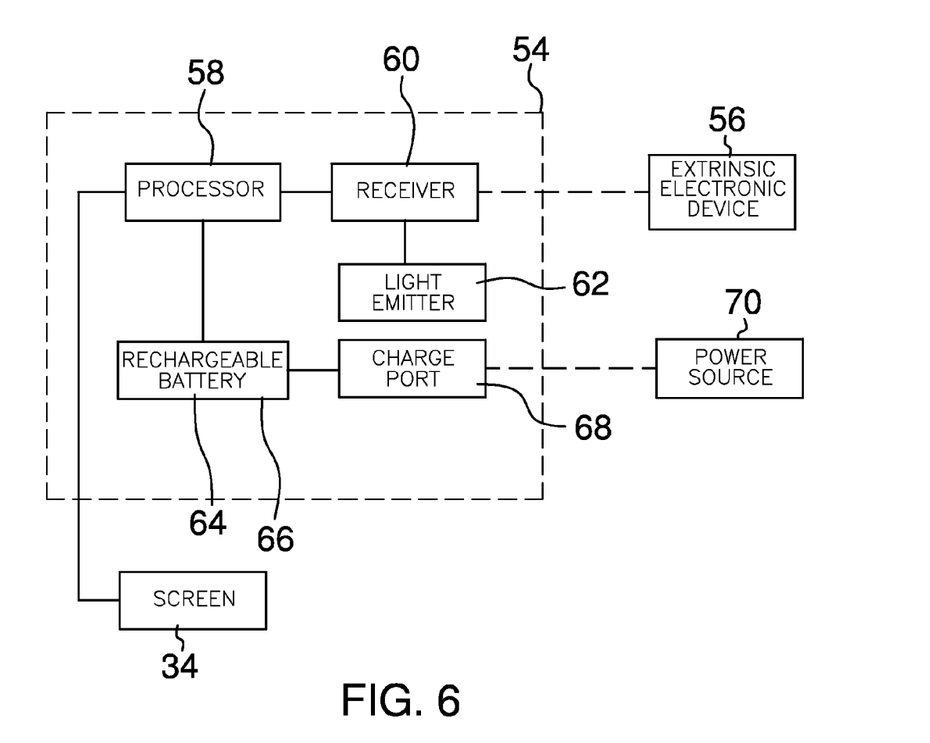
FIG. 6 is a schematic view of an embodiment of the disclosure.

With reference now to the drawings, and in particular to FIGS. 1 through 6 thereof, a new display device embodying the principles and concepts of an embodiment of the disclosure and generally designated by the reference numeral 10 will be described.

As best illustrated in FIGS. 1 through 6, the retractable display assembly 10 generally comprises a housing 12 that has a stand portion 14 and a storage portion 16. The stand portion 14 is hingedly coupled to the storage portion 16 and the stand portion 14 is positionable in a deployed position. Thus, the stand portion 14 supports the storage portion 16 on a support surface 18. The support surface 18 may be a table or the like.

The housing 12 has a first end 20, a second end 22 and an outer wall 24 extending between the first end 20 and the second end 22. The housing 12 is elongated between the first end 20 and the second end 22 and the outer wall 24 is curved such that the housing 12 has a cylindrical shape. The stand portion 14 extends substantially between the first end 20 and the second end 22 and the stand portion 14 has a first lateral edge 26 and a second lateral edge 28. The first lateral edge 26 is hingedly coupled to the outer wall 24 corresponding to the storage portion 16.

The outer wall 24 corresponding to the stand portion 14 is aligned with the outer wall 24 corresponding to the storage portion 16 when the stand portion 14 is positioned in a stored position. The stand portion 14 extends away from the storage portion 16 when the stand portion 14 is positioned in the deployed position. Thus, the second lateral edge 28 may abut the support surface 18 thereby inhibiting the housing 12 from rolling on the support surface 18.

The outer wall 24 corresponding to the storage portion 16 has a first slot 30 extending therethrough. The first slot 20 extends substantially between the first end 20 and the second end 22. The outer wall 24 corresponding to the storage portion 16 has a second slot 32 extending therethrough. The second slot 32 extends substantially between the first end 20 and the second end 22 and the first slot 20 is spaced from the second slot 32.

A screen 34 is positioned within the housing 12 and the screen 34 is comprised of a flexible material that is capable of electronically displaying an image. The screen 34 may comprise a flexible organic light-emitting diode. The screen 34 is rollably coupled to the housing 12 such that the screen 34 is positionable in a deployed position having the screen 34 extending outwardly from the storage portion 16. The screen 34 is positionable in a stored position having the screen 34 being contained within the storage portion 16.

The screen 34 extends outwardly from the first slot 30 when the screen 34 is positioned in the deployed position. The screen 34 has a distal edge 36 with respect to the housing 12 when the screen 34 is positioned in the deployed position. A tab 38 is coupled to the screen 34 and the tab 38 is positioned adjacent to the distal edge 36. The tab 38 may be gripped thereby facilitating the screen 34 to be positioned in the deployed position and the tab 38 is centrally positioned on the distal edge 36.

A spool 40 is positioned within the storage portion 16 and the spool 40 extends between the first end 20 and the second end 22. The spool 40 has the screen 34 coupled thereto. The spool 40 is biased to rotate in a retracting direction such that the spool 40 urges the screen 34 into the stored position. The spool 40 may comprise a spring actuated retraction spool or the like.

A support 42 is provided and the support 42 is hingedly coupled to the housing 12. The support 42 is positionable in a deployed position having the support 42 extending outwardly from the storage portion 16. The support 42 engages the screen 34 when the screen 34 is positioned in the deployed position and the support 42 is positioned in the deployed position. Thus, the screen 34 is retained in the deployed position. The support 42 is positionable in a stored position having the support 42 being contained within the storage position 16.

The support 42 has a first portion 44 and a second portion 46 and the second portion 46 is hingedly coupled to the first portion 44. The first portion 44 is hingedly coupled to the storage portion 16. The first portion 44 extends outwardly from the second slot 32 when the support 42 is positioned in the deployed position. The first portion 44 has a distal end 48 with respect to the housing 12 and the second portion 46 is hingedly coupled to the distal end 48. The second portion 46 is positionable in a retracted position having the second portion 46 being coextensive with the first portion 44. The second portion 46 is positionable in an extended position such that the second portion 46 extends laterally away from the first portion 44. The second portion 46 is spaced from the housing 12 when the first portion 44 is positioned in the deployed position and the second portion 46 is positioned in the extended position. The second portion 46 has a distal end 50 with respect to the first portion 44.

A hook 52 is attached to the second portion 46 of the support 42 and the hook 52 is positioned adjacent to the distal end 50 of the second portion 46. The hook 52 engages the tab 38 when the screen 34 is positioned in the deployed position and the second portion 46 is positioned in the extended position. Thus, the support 42 retains the screen 34 in the deployed position.

A control circuit 54 is coupled to the housing 12 and the control circuit 54 is electrically coupled to the screen 34. The control circuit 54 is selectively placed in communication with an extrinsic electronic device 56 such that the control circuit 54 receives data pertaining to images from the extrinsic electronic device 56. Thus, the screen may display the images. The images may comprise photos or the images may comprise a video. The extrinsic electronic device 56 may comprise a Smart Phone or the like.

The control circuit 54 includes a processor 58 that is positioned within the storage portion 16. The processor 58 may comprise an electronic processor or the like. A receiver 60 is positioned within the storage portion 16 and the receiver 60 is electrically coupled to the processor 58. The receiver 60 is selectively placed in electrical communication with the extrinsic electronic device 56 such that the receiver 60 receives the data pertaining to the images from the extrinsic electronic device 56. The receiver 60 may comprise a radio frequency receiver that utilizes a frequency of 2.4 GHz and the receiver 60 may comprise a Bluetooth receiver or the like.

A light emitter 62 is coupled to the outer wall 24 corresponding to the storage portion 16 and the light emitter 62 is electrically coupled to the receiver 60. The light emitter 62 emits light when the receiver 60 is placed in electrical communication with the extrinsic electronic device 56. A power supply 64 is positioned within the storage portion 16 and the power supply 64 is electrically coupled to the processor 58. The power supply 64 comprises at least one rechargeable battery 66.

A charge port 68 is provided and the charge port 68 is positioned on the second end 22 of the housing 12. The charge port 68 is electrically coupled to the power supply 64. The charge port 68 may be electrically coupled to a power source 70 thereby facilitating the power supply 64 to be charged. The charge port 68 may comprise a USB port or the like and the power source 70 may be the extrinsic electronic device 56 or the like.

In use, the stand portion 14 is positioned in the deployed position and the housing 12 is positioned on the support surface 18. The support 42 is positioned in the deployed position and the second portion 46 of the support 42 is positioned in the extended position. The tab 38 is gripped and the screen 34 is urged into the deployed position. The screen 34 is manipulated to facilitate the hook 52 to engage the screen 34 such that the screen 34 is retained in the deployed position. The extrinsic electronic device 56 is placed in electrical communication with the receiver 60 and the screen 34 displays images stored in the extrinsic electronic device 56. The screen 34 facilitates the images to be displayed in a larger format with respect to the extrinsic electronic device 56 thereby facilitating the images to be viewed from a distance.

With respect to the above description then, it is to be realized that the optimum dimensional relationships for the parts of an embodiment enabled by the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by an embodiment of the disclosure.

Therefore, the foregoing is considered as illustrative only of the principles of the disclosure. Further, since numerous modifications and changes will readily occur to those skilled in the art, it is not desired to limit the disclosure to the exact construction and operation shown and described, and accordingly, all suitable modifications and equivalents may be resorted to, falling within the scope of the disclosure. In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be only one of the elements.

I claim:

1. A retractable display assembly configured to be electrically coupled to an extrinsic electronic device thereby facilitating images received from the extrinsic electronic device to be displayed, said assembly comprising:

a housing having a stand portion and a storage portion, said stand portion being hingedly coupled to said storage portion, said stand portion being positionable in a deployed position wherein said stand portion is configured to support said storage portion on a support surface, wherein said housing has a first end, a second end and an outer wall extending between said first end and said second end, said housing being elongated between said first end and said second end, said outer wall being curved such that said housing has a cylindrical shape, wherein said stand portion extends substantially between said first end and said second end, said stand portion having a first lateral edge and a second lateral edge, said first lateral edge being hingedly coupled to said outer wall corresponding to said storage portion, said stand portion being arcuate and flush with said storage portion in a stored position wherein said housing is cylindrical when said stand is in said stored position;

a screen being positioned within said housing, said screen being comprised of a flexible material that is capable of electronically displaying an Image, said screen being rollably coupled to said housing such that said screen is positionable in a deployed position having said screen extending outwardly from said storage portion, said screen being positionable in a stored position having said screen being contained within said storage portion;

a support being hingedly coupled to said housing, said support being positionable in a deployed position having said support extending outwardly from said storage portion, said support engaging said screen when said screen is positioned in said deployed position and said support is positioned in said deployed position such that said screen is retained in said deployed position, said support being positionable in a stored position having said support being contained within said storage position;

and a control circuit being coupled to said housing, said control circuit being electrically coupled to said screen, said control circuit being configured to be in communication with an extrinsic electronic device such that said control circuit receives data pertaining to images from the extrinsic electronic device thereby facilitating said screen to display the images;

wherein said housing has a first slot; and said screen extends outwardly from said first slot when said screen is positioned in said deployed position, said screen having a distal edge with respect to said housing when said screen is positioned in said deployed position;

wherein: said housing has a second slot; and said support has a first portion and a second portion, said second portion being hingedly coupled to said first portion, said first portion being hingedly coupled to said storage portion, said first portion extending outwardly from said second slot at a 90 degree angle from said housing when said support is positioned in said deployed position;

wherein said first portion has a distal end with respect to said housing, said second portion being hingedly coupled to said distal end;

wherein said second portion is positionable in a retracted position having said second portion being coextensive with said first portion, said second portion being positionable in an extended position such that said second portion extends laterally away from said first portion, said second portion being spaced from said housing when said first portion is positioned in said deployed position and said second portion is positioned in said extended position, said second portion having a distal end with respect to said first portion, said second portion is positioned at a 90 degree angle from said first portion when said support is positioned in said deployed position;

a hook being attached to said second portion of said support, said hook being positioned adjacent to said distal end of said second portion, said hook engaging said distal edge of said screen when said screen is positioned in said deployed position and said second portion is positioned in said extended position such that said support retains said screen in said deployed position.

2. The assembly according to claim 1, wherein said outer wall corresponding to said stand portion is aligned with said outer wall corresponding to said storage portion when said stand portion is positioned in said stored position, said stand portion extending away from said storage portion when said stand portion is positioned in said deployed position wherein said second lateral edge is configured to abut the support surface thereby inhibiting said housing from rolling on the support surface.

3. The assembly according to claim 1, wherein said outer wall corresponding to said storage portion having a first slot extending therethrough, said first slot extending substantially between said first end and said second end.

4. The assembly according to claim 3, wherein said outer wall corresponding to said storage portion has a second slot extending therethrough, said second slot extending substantially between said first end and said second end, said first slot being spaced from said second slot.

5. The assembly according to claim 1, wherein said control circuit includes:
    a processor being positioned within said storage portion; and
    a receiver being positioned within said storage portion, said receiver being electrically coupled to said processor, said receiver being configured to be in electrical communication with the extrinsic electronic device such that said receiver receives the data pertaining to the images from the extrinsic electronic device.

6. The assembly according to claim 5, wherein said control circuit further includes a light emitter being coupled to an outer wall of said housing corresponding to said storage portion, said light emitter being electrically coupled to said receiver, said light emitter emitting light when said receiver is in electrical communication with the extrinsic electronic device.

7. The assembly according to claim 5, wherein said control circuit further includes:
    a power supply being positioned within said storage portion, said power supply being electrically coupled to said processor, said power supply comprising at least one rechargeable battery; and
    a charge port, said charge port being positioned on a second end of said housing, said charge port being electrically coupled to said power supply, said charge port being configured to be electrically coupled to a power source thereby facilitating said power supply to be charged.

8. A retractable display assembly configured to be electrically coupled to an extrinsic electronic device thereby facilitating images received from the extrinsic electronic device to be displayed, said assembly comprising:
    a housing having a stand portion and a storage portion, said stand portion being hingedly coupled to said storage portion, said stand portion being positionable in a deployed position wherein said stand portion is configured to support said storage portion on a support surface, said housing having a first end, a second end and an outer wall extending between said first end and said second end, said housing being elongated between said first end and said second end, said outer wall being curved such that said housing has a cylindrical shape, said stand portion extending substantially between said first end and said second end, said stand portion having a first lateral edge and a second lateral edge, said first lateral edge being hingedly coupled to said outer wall corresponding to said storage portion, said outer wall corresponding to said stand portion being aligned with said outer wall corresponding to said storage portion when said stand portion is positioned in a stored position, said stand portion extending away from said storage portion when said stand portion is positioned in said deployed position wherein said second lateral edge is configured to abut the support surface thereby inhibiting said housing from rolling on the support surface, said outer wall corresponding to said storage portion having a first slot extending therethrough, said first slot extending substantially between said first end and said second end, said outer wall corresponding to said storage portion having a second slot extending therethrough, said second slot extending substantially between said first end and said second end, said first slot being spaced from said second slot;

a screen being positioned within said housing, said screen being comprised of a flexible material that is capable of electronically displaying an Image, said screen being rollably coupled to said housing such that said screen is positionable in a deployed position having said screen extending outwardly from said storage portion, said screen being positionable in a stored position having said screen being contained within said storage portion, said screen extending outwardly from said first slot when said screen is positioned in said deployed position, said screen having a distal edge with respect to said housing when said screen is positioned in said deployed position;

a spool being positioned within said storage portion, said spool extending between said first end and said second end, said spool having said screen being coupled thereto, said spool being biased to rotate in a retracting direction such that said spool urges said screen into said stored position;

a support being hingedly coupled to said housing, said support being positionable in a deployed position having said support extending outwardly from said storage portion, said support engaging said screen when said screen is positioned in said deployed position and said support is positioned in said deployed position such that said screen is retained in said deployed position, said support being positionable in a stored position having said support being contained within said storage position, said support having a first portion and a second portion, said second portion being hingedly coupled to said first portion, said first portion being hingedly coupled to said storage portion, said first portion extending outwardly from said second slot at an 90 degree angle from said housing when said support is positioned in said deployed position, said first portion having a distal end with respect to said housing, said second portion being hingedly coupled to said distal end, said second portion being positionable in a retracted position having said second portion being coextensive with said first portion, said second portion being positionable in an extended position such that said second portion extends laterally away from said first portion, said second portion being spaced from said housing when said first portion is positioned in said deployed position and said second portion is positioned in said extended position, said second portion having a distal end with respect to said first portion, said second portion is positioned at a 90 degree angle from said first portion when said support is positioned in said deployed position;

a hook being attached to said second portion of said support, said hook being positioned adjacent to said distal end of said second portion, said hook engaging said distal edge of said screen when said screen is positioned in said deployed position and said second portion is positioned in said extended position such that said support retains said screen in said deployed position; and a control circuit being coupled to said housing, said control circuit being electrically coupled to said screen, said control circuit being configured to be in communication with an extrinsic electronic device such that said control circuit receives data pertaining to images from the extrinsic electronic device thereby facilitating said screen to display the Images, said control circuit including:

a processor being positioned within said storage portion, a receiver being positioned within said storage portion, said receiver being electrically coupled to said processor, said receiver being configured to be in electrical communication with the extrinsic electronic device such that said receiver receives the data pertaining to the Images from the extrinsic electronic device, a light emitter being coupled to said outer wall corresponding to said storage portion, said light emitter being electrically coupled to said receiver, said light emitter emitting light when said receiver is in electrical communication with the extrinsic electronic device, a power supply being positioned within said storage portion, said power supply being electrically coupled to said processor, said power supply comprising at least one rechargeable battery, and a charge port, said charge port being positioned on said second end, said charge port being electrically coupled to said power supply, said charge port being configured to be electrically coupled to a power source thereby facilitating said power supply to be charged.

* * * * *